(12) United States Patent
Kim et al.

(10) Patent No.: US 6,436,775 B2
(45) Date of Patent: Aug. 20, 2002

(54) MOSFET DEVICE FABRICATION METHOD CAPABLE OF ALLOWING APPLICATION OF SELF-ALIGNED CONTACT PROCESS WHILE MAINTAINING METAL GATE TO HAVE UNIFORM THICKNESS

(75) Inventors: Tae Kyun Kim; Se Aug Jang, both of Kyoungki-do; In Seok Yeo, Seoul, all of (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 09/884,052

(22) Filed: Jun. 20, 2001

(30) Foreign Application Priority Data

Jun. 21, 2000 (KR) ........................ 2000-34318
Jun. 21, 2000 (KR) ........................ 2000-34322

(51) Int. Cl.[7] ............................. H01L 21/336
(52) U.S. Cl. .................. 438/301; 438/585; 438/592
(58) Field of Search ..................... 438/291, 305, 438/595, 301

(56) References Cited

U.S. PATENT DOCUMENTS

| | | | | |
|---|---|---|---|---|
| 5,091,763 A | * | 2/1992 | Sanchez | 357/23.9 |
| 5,495,121 A | * | 2/1996 | Yamazaki et al. | 257/384 |
| 5,658,811 A | * | 8/1997 | Kimura et al. | 438/289 |
| 6,054,355 A | * | 4/2000 | Inumiya et al. | 438/296 |
| 6,184,113 B1 | * | 2/2001 | Seo et al. | 438/585 |
| 6,251,763 B1 | * | 6/2001 | Inumiya et al. | 438/595 |

* cited by examiner

*Primary Examiner*—John F. Niebling
*Assistant Examiner*—Angel Roman
(74) *Attorney, Agent, or Firm*—Birch, Stewart, Kolasch & Birch, LLP

(57) ABSTRACT

The MOSFET fabrication method allows application of a self-aligned contact (SAC) process while maintaining a metal gate, such as a tungsten gate, to have a uniform thickness. The process involves forming a metal oxide film during the formation of a metal gate structure of the MOSFET device. The metal oxide film is formed by subjecting the gate structure through a rapid thermal oxidation (RTO) treatment and then to an $N_2O$ plasma treatment. The treatments allow the thickness of the metal oxide to be precisely controlled. The metal oxide acts as an insulator, which prevents electrical shorts between the gate structure and a contact plug even if a misalignment of occurs during the SAC process. This is an improvement from the conventional practice of separately forming a SAC barrier film after the formation of the metal gate structure and thus saves money, time, and increases reliability and productivity. Also the performance characteristics of the device is enhanced.

16 Claims, 11 Drawing Sheets

MOSFET DEVICE FABRICATION METHOD CAPABLE OF ALLOWING APPLICATION OF SELF-ALIGNED CONTACT PROCESS WHILE MAINTAINING METAL GATE TO HAVE UNIFORM THICKNESS

BACKGROUND OF THE INVENTION

1. Field of the Invention

The present invention relates to a method for fabricating a MOSFET device, and more particularly to a MOSFET fabrication method capable of allowing application of a self-aligned contact process while maintaining a metal gate to have a uniform thickness.

2. Description of the Related Art

It is well known that gates of transistors are mainly made of polysilicon. This is because polysilicon sufficiently meets desired properties required for gates such as a high melting point, ease of forming thin films, ease of patterning lines, stability in an oxidation atmosphere, and formation of planarized surfaces. Further, where polysilicon gates are applied to MOSFET devices, a desired resistance can be obtained by doping the gate with impurities such as phosphorous (P), arsenic (As), or boron (B).

As the level of integration of semiconductor devices increases, parameter values of the device correspondingly are affected. For example, the line width of gates, the thickness of gate insulating films, and the junction depth decrease. For this reason, where highly integrated semiconductor devices are fabricated using polysilicon, it is difficult to realize a low resistance required in association with the decrease in the micro line width. Thus, it is required to develop gates made of a new material as a substitute for polysilicon.

Active research and development efforts have been made in association with polycide gates made of a transition metal-silicide material. However, such polycide gates also have a limitation in realizing a low resistance since polysilicon remains a part of the gate material. Semiconductor devices having a polycide gate involve an increase in the effective thickness of a gate insulating film due to a gate depletion effect resulting from polysilicon present in the polycide gate. Also, there may be a variation in threshold voltage resulting from boron penetration and dopant distribution fluctuation occurring in a p+ polysilicon gate. For this reason, use of polycide to achieve low resistance gates is limited.

To this end, active research and development have recently been made in association with metal gates. Metal gates solve the above-mentioned problems involved in semiconductor devices using polycide gates because they do not use any dopant. Also, if the metal gate is made of a metal having a work function value corresponding to the mid band-gap of silicon, it can be fabricated into a single gate usable for both the NMOS and PMOS types. The metal having a work function value corresponding to the mid band-gap of silicon include tungsten (W), tungsten nitride (WN), titanium (Ti), titanium nitride (TiN), molybdenum (Mo), tantalum (Ta), and tantalum nitride (TaN).

Unfortunately, such metal gates have problems as well. When manufacturing MOSFET devices with such metal gates, there are processing difficulties. These difficulties include difficulty in etching associated metal films, damage to the silicon substrate during the etching process, and thermal damage resulting from a thermal process conducted following the etching process.

For these reasons, it is difficult to form a metal gate using conventional gate formation processes. To this end, a method has been proposed in which metal gates are formed using a damascene process, which is mainly used in the formation of metal lines.

The metal gate formation method using the damascene process involves forming a transistor including a sacrificial gate made of polysilicon, forming an interlayer insulating film, removing the sacrificial gate, depositing a metal film, and conducting a chemical mechanical polishing (CMP) process for the metal film. Since this method does not involve etching when forming the metal gate, it avoids degradation in the characteristics of the final product while allowing the use of conventional MOSFET process.

Figure 1A:
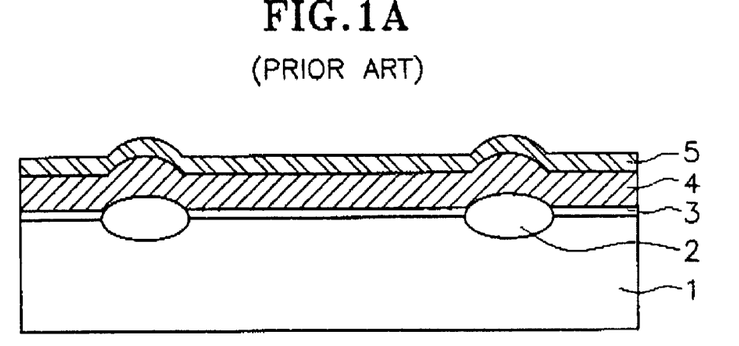
FIGS. 1A to 1E are cross-sectional views illustrating a conventional method for forming a tungsten gate using a damascene process.

A conventional metal gate formation method using a damascene process will be described in conjunction with FIGS. 1A to 1E. Referring to FIG. 1A, field oxide films 2 are formed on a silicon substrate 1 to define an active region. A first thermal oxide film 3 is formed on the silicon substrate 1 to cover the active region. Thereafter, a polysilicon film 4 and a hard mask film 5 are sequentially deposited on the field oxide film 2 and first thermal oxide film 3.

Figure 1B:
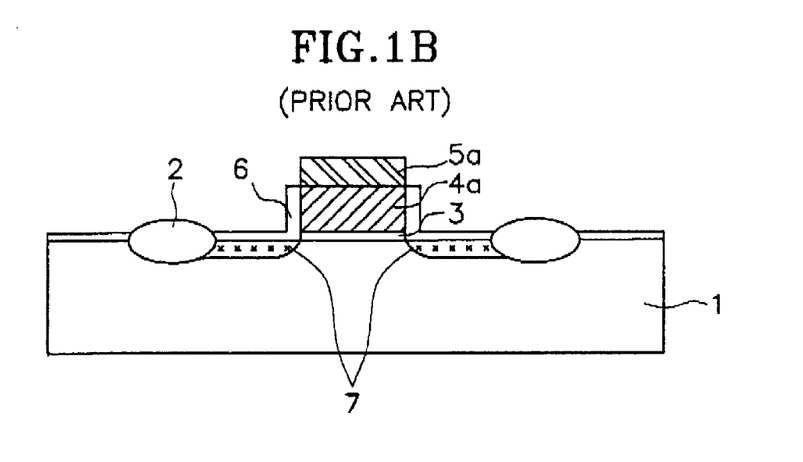

Referring to FIG. 1B, a hard mask pattern 5a defining a gate formation region is formed by patterning the hard mask film 5 by photolithography. The polysilicon film 4 and first thermal oxide film 3 are then etched (no metal gate has been formed yet) using the hard mask pattern 5a as an etch mask. As a result, a first intermediate structure is formed including a sacrificial gate 4a.

The first intermediate structure is subjected to a gate re-oxidation process, so that a second thermal oxide film 6 is formed on the sides of the sacrificial gate 4a and the exposed surface of the silicon substrate 1. Subsequently, impurity ions are implanted in low concentrations into portions of the silicon substrate 1 on both sides of the sacrificial gate 4a through the second thermal oxide film 6. As a result, lightly doped drain (LDD) regions 7 are formed.

Figure 1C:
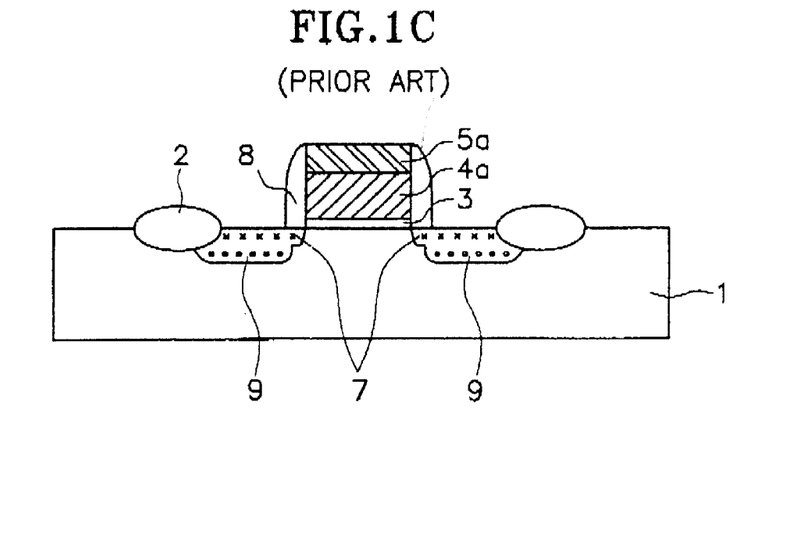

Referring to FIG. 1C, the second thermal oxide film 6 is then removed. Thereafter, spacers 8 are formed on sides of the sacrificial gate 4a, the hard mask pattern 5a, and the remaining thermal oxide 3. Impurity ions are then implanted in high concentrations into portions of the silicon substrate 1 again on both sides of the sacrificial gate 4a including the spacers 8. As a result, a second intermediate structure is formed including source/drain regions 9.

Figure 1D:
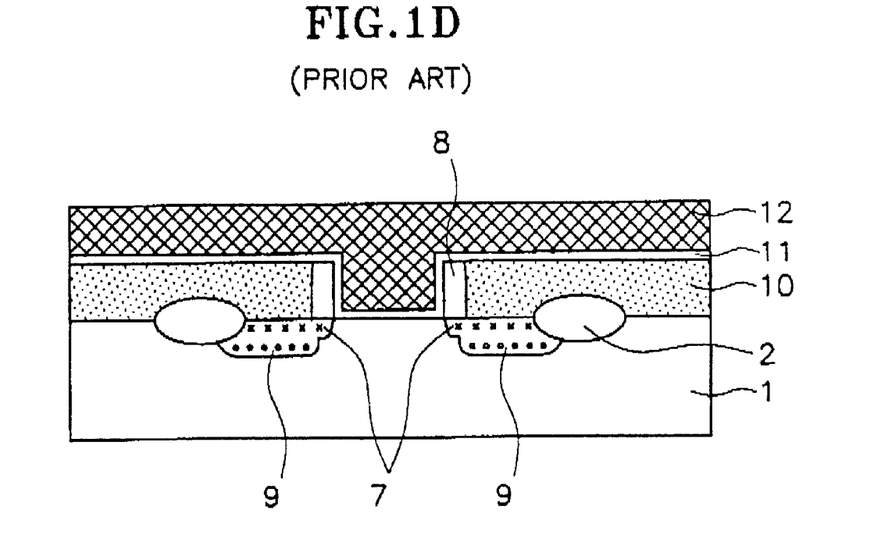

Referring to FIG. 1D, an interlayer insulating film 10 is deposited on the second intermediate structure obtained after completion of the processing steps shown in FIG. 1C. Thereafter, the interlayer insulating film 10 and the hard mask pattern 5a are polished using a CMP process with the sacrificial gate 4a acting as a polishing stop layer at point where the sacrificial gate 4a is exposed. Then the sacrificial gate 4a and the first thermal oxide film 3 disposed beneath the sacrificial gate 4a are removed to define a groove, thereby forming a third intermediate structure. A metal gate is later formed in the groove.

A uniformly thick gate insulating film 11 is formed on the third intermediate structure. Subsequently, a tungsten film 12 is deposited on the gate insulating film 11 so that it completely fills the groove.

Figure 1E:
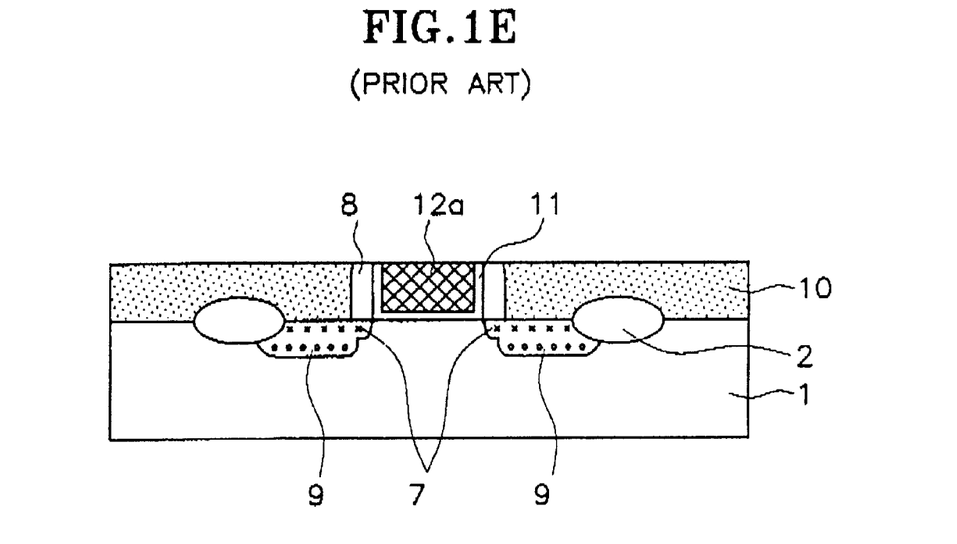

Referring to FIG. 1E, a tungsten gate 12a is then formed by polishing the tungsten film 12 and gate insulating film 11 using a CMP process with the interlayer insulating film 10 acting as a polishing stop layer.

Since the tungsten gate 12a is formed using a damascene process, as mentioned above, it has a desired reliability.

Accordingly, the MOSFET device having the tungsten gate 12a can be expected to have improved characteristics.

However, this MOSFET device having the tungsten gate 12a is subjected to degradation in characteristic due to a self-aligned contact (SAC) process that is subsequently conducted. This is because there is no barrier film for the SAC process. Multiple processing steps are necessary to form a SAC barrier film. The additional steps are disadvantageous in terms of productivity.

Figure 2:
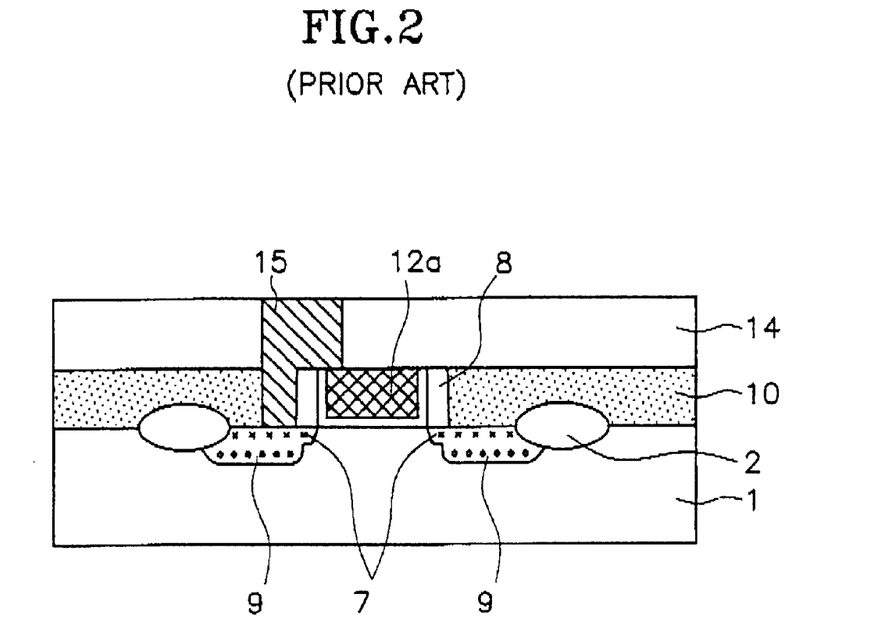
FIGS. 2 and 3 are cross-sectional views illustrating problems with a MOSFET device having a conventional tungsten gate.
Figure 3:
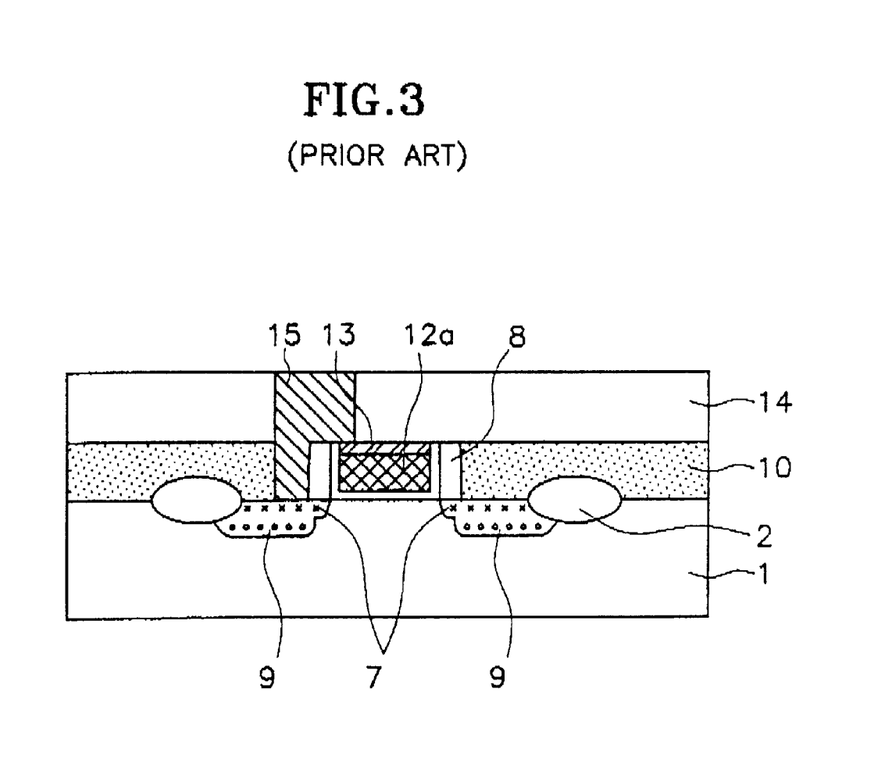

Problems involved in the above mentioned SAC process will now be described in detail, with reference to FIGS. 2 and 3. Here, the SAC process and the SAC barrier film formation process are well known, so that their description are omitted. In FIGS. 2 and 3, the reference numeral 13 denotes a SAC barrier film, 14 an insulating film, and 15 a contact plug.

When a misalignment occurs, as shown in FIG. 2, an electrical short circuit may result between the tungsten gate 12a and the contact plug due to the lack of the SAC barrier film on the tungsten gate 12a. Thus, the reliability and other characteristics of the MOSFET device are compromised.

The electrical short circuit between tungsten gate 12a and contact plug 15 may be avoided by forming a SAC barrier film 13 made of, for example, a nitride film, on the tungsten gate 12a. However, the formation of the SAC barrier film 13 requires an increase in the manufacturing time and therefore costs of the MOSFET device because the film necessarily involves the additional process of etching the tungsten gate, depositing a nitride film, and polishing the nitride film. Consequently, productivity is reduced.

An important factor to be taken into consideration in the manufacture of MOSFET devices is to maintain the surface resistance of the gate to be at or below an acceptable maximum level. Here, the surface resistance of the gate depends on the thickness uniformity of the gate.

However, where the tungsten gate is etched at its surface to have a reduced thickness in accordance with a dry etching process, it may not have a desired thickness uniformity after completion of the etching process since there is no etch stop layer. In particular, it is difficult to etch all tungsten gates distributed throughout the substrate to have a uniform etch depth.

Furthermore, if the etching device is unstable, the tungsten gate will be either excessively or insufficiently etched. Then it becomes impossible to maintain a desired thickness uniformity of the tungsten gate. If such is the case, the tungsten gate may have a surface resistance exceeding the acceptable threshold value. As a result, the MOSFET device may exhibit degraded characteristics.

SUMMARY OF THE INVENTION

Therefore, an object of the invention is to provide a MOSFET fabrication method capable of allowing application of a SAC process while maintaining a tungsten gate to have a uniform thickness.

In accordance with the present invention, this object is accomplished by providing a method for fabricating a MOSFET device comprising: forming field oxide films on a prepared substrate defining an active region; forming a sacrificial gate on the active region; forming a lightly doped drain (LDD) source/drain regions in the substrate on both sides of the sacrificial gate and forming an interlayer insulating film on a resulting structure; removing the sacrificial gate to define a groove region where a metal gate is to be formed; forming a gate insulating film on the interlayer insulating film and in the groove region; depositing a metal film on the gate insulating film and filling the groove region; polishing the metal film and the gate insulating film thereby leaving the metal film in the groove forming the metal gate; and oxidizing the metal gate thereby forming a metal oxide film having a desired thickness on the surface of the metal gate.

In another aspect of the invention, the object of the invention is accomplished by a method comprising: forming a sacrificial gate structure on an active region of a substrate; forming LDD regions in the substrate on both sides of the sacrificial gate in the active region using the sacrificial gate structure as a mask; forming spacers on the sides of the sacrificial gate; forming HDD regions in the substrate on both sides of the sacrificial gate in the active region using the sacrificial gate structure and the spacer as a mask; depositing an interlayer insulating film on the active region of the substrate and on the sacrificial gate structure; polishing the interlayer insulating film exposing the sacrificial gate structure; removing the sacrificial gate structure forming a groove such that spacers define sides of the groove and the substrate is exposed within the groove; depositing a gate insulating film in the groove such that the groove is not completely filled; forming a metal gate by depositing a metal film in a remainder of the groove; and forming a metal oxide on the metal gate.

In a further aspect of the invention, the object of the invention is accomplished by a device comprising: a substrate; at least two field oxide films defining an active region on the substrate; a metal gate formed over the substrate within the active region with a metal oxide SAC barrier film at a top of the metal gate; lightly doped source and drain regions formed in the substrate on both sides of the metal gate; and heavily doped source and drain regions formed in the substrate on both sides of the metal gate.

BRIEF DESCRIPTION OF THE DRAWINGS

The above objects, and other features and advantages of the present invention will become more apparent after a reading of the following detailed description when taken in conjunction with the drawings, in which.

DESCRIPTION OF THE PREFERRED EMBODIMENTS

FIGS. 4A to 4G are cross-sectional views illustrating a method for fabricating a MOSFET device in accordance with the preferred embodiment of the present invention.

Figure 4A:
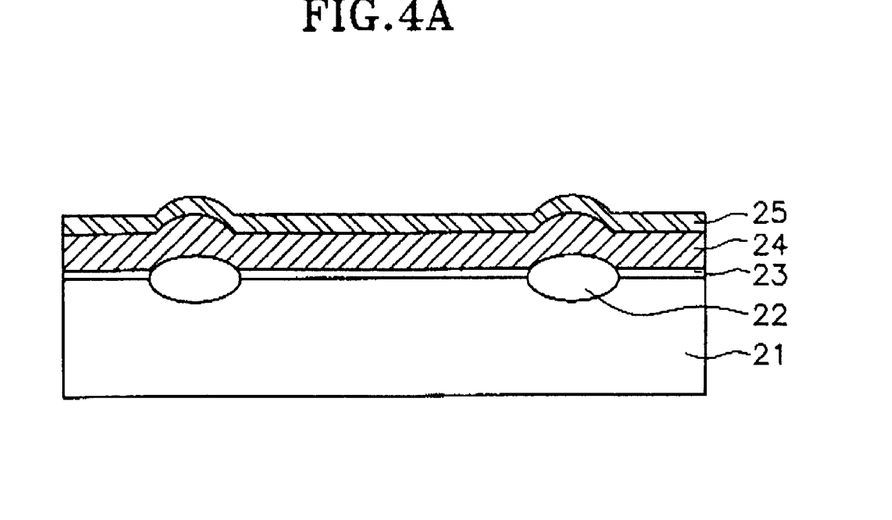
FIGS. 4A to 4G are cross-sectional views illustrating a method for fabricating a MOSFET device in accordance with a preferred embodiment of the present invention.

Referring to FIG. 4A, field oxide films 22 are formed on a silicon substrate 21 to define an active region. A first thermal oxide film 23 is formed on the silicon substrate 21 with a thermal oxidation process and covers the active region. Thereafter, a polysilicon film 24 is deposited to a thickness of 2,000 to 4,000 Å on the field oxide films 22 and the first thermal oxide film 23 through a low pressure chemical vapor deposition (LPCVD) process. A hard mask film 25, made of a nitride or an oxide film, is then deposited to a thickness of 800 to 1,000 Å on the polysilicon film 24.

The polysilicon film 24 is doped with impurities. The doping may be achieved in an in-situ fashion during the deposition of the polysilicon film 24. Alternatively, the doping may be achieved with an ion implantation process after the deposition of the polysilicon film 24.

Figure 4B:
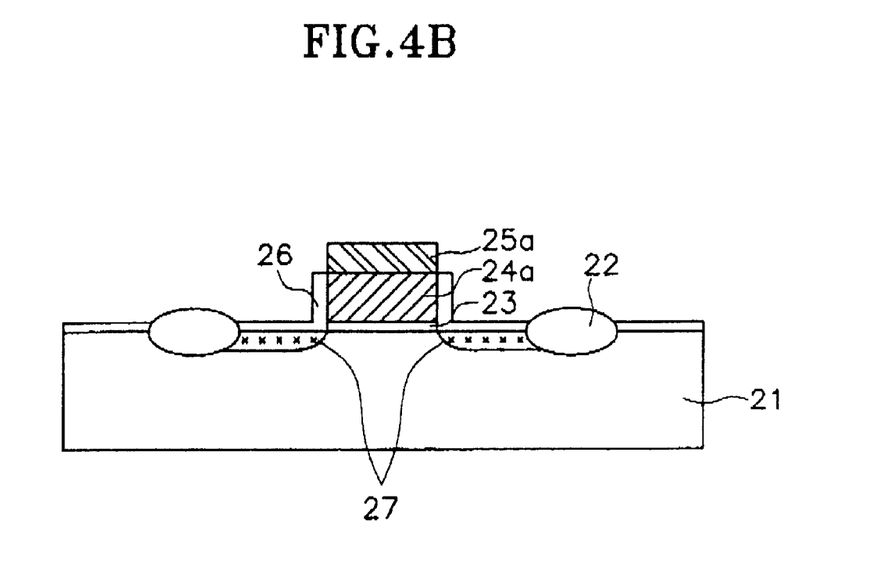

Referring to FIG. 4B, a hard mask pattern 25a defining a gate formation region is formed by patterning the hard mask film 25 through photolithography. The polysilicon film 24 and the first thermal oxide film 23 are then etched using the hard mask pattern 25a as an etch mask. As a result, a first intermediate structure is formed including a sacrificial gate 24a on the active region 21.

The first intermediate structure is subjected to a gate re-oxidation process. This gate re-oxidation process is adapted to remove damages possibly generated in the silicon substrate 21 during the etch process for the formation Qf the sacrificial gate 24a. The gate re-oxidation process also helps to avoid damages from being generated in the silicon substrate 21 during a subsequent ion implantation process for the formation of source/drain regions.

After completion of the gate re-oxidation process, a second thermal oxide film 26 is formed, to a thickness of 30 to 100 Å, on sides of the sacrificial gate 24a and the portion of the silicon substrate 21 corresponding to the active region. Subsequently, impurity ions are implanted in low concentrations into portions of the silicon substrate 1 on both sides of the sacrificial gate 24a. As a result, lightly doped drain (LDD) regions 27 are formed.

Figure 4C:
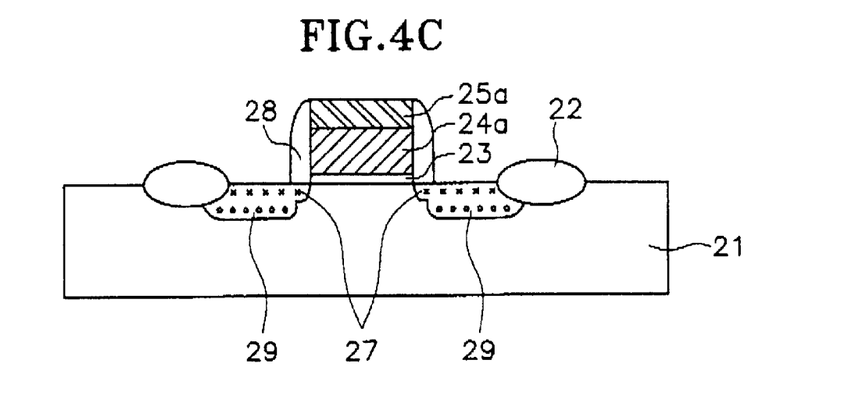

Referring to FIG. 4C, the second thermal oxide film 26 is then removed. Thereafter, an oxide film is deposited to a thickness of 900 to 1,200 Å on the resultant structure obtained after the removal of the second thermal oxide film. The deposited oxide film is then blanket-etched, thereby forming spacers 28 on sides of the sacrificial gate 24a, the hard mask pattern 25a, and the remaining thermal oxide 23. Impurity ions are then implanted in high concentrations into portions of the silicon substrate 21 again on both sides of the sacrificial gate 24a. As a result, a second intermediate structure is formed including source/drain regions 29.

Figure 4D:
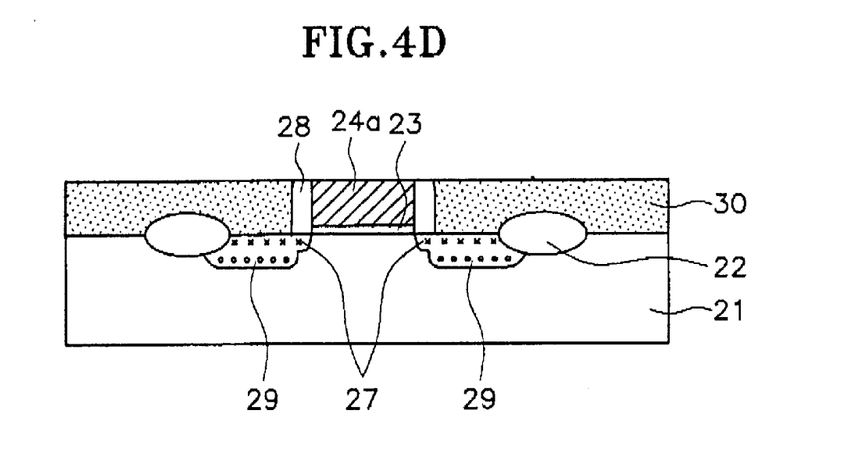

Referring to FIG. 4D, an interlayer insulating film 30 is deposited to a thickness of 4,000 to 6,000 Å on the second intermediate structure. Thereafter, the interlayer insulating film 30 and hard mask pattern 25a are polished using a CMP process with the sacrificial gate 24a acting as a polishing stop layer, at which point the sacrificial gate 24a is exposed. The interlayer Insulating film 30 is also planarized.

Figure 4E:
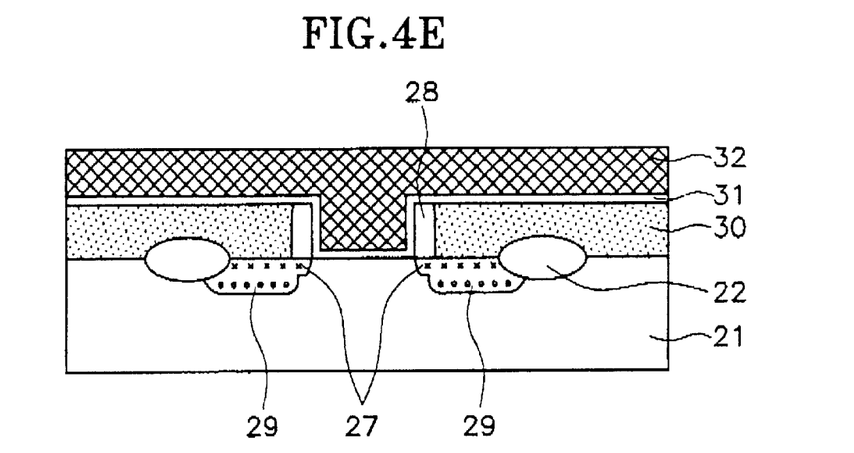

Referring to FIG. 4E, the exposed sacrificial gate 24a and the first thermal oxide film 23 disposed beneath the sacrificial gate 24a are then removed with a dry etching process defining a groove, thereby forming a third intermediate structure.

A uniformly thick gate insulating film 31 is formed on the third intermediate structure including the groove. Subsequently, a tungsten film 32 is deposited on the gate insulating film 31 and fills the groove. Note that other metals, such as tungsten nitride (WN), titanium (Ti), titanium nitride (TiN), molybdenum (Mo), tantalum (Ta), and tantalum nitride (TaN) may be used.

Figure 4F:
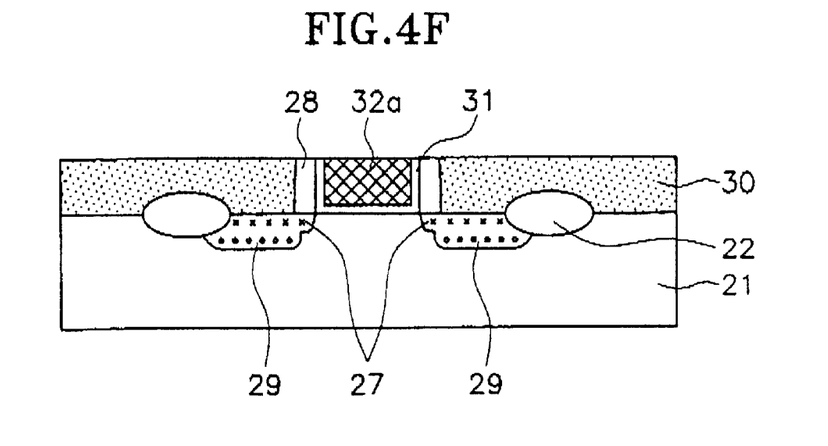

Referring to FIG. 4F, a tungsten gate 32a is then formed by polishing the tungsten film 32 and gate insulating film 31 using a CMP process until the interlayer insulating film 30 is exposed. Thus, a MOSFET device having the tungsten gate 32a is obtained.

Figure 4G:
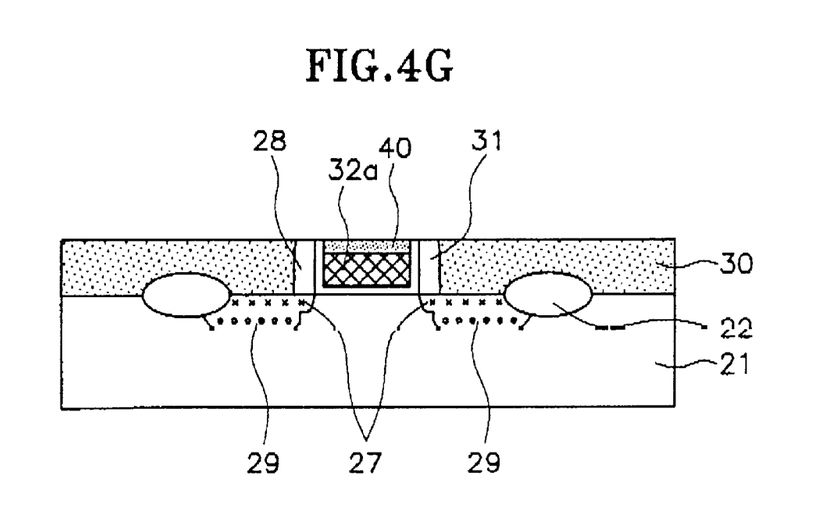

Referring to FIG. 4G, an oxidation process is carried out for the tungsten gate 32a thereby forming a tungsten oxide film ($WO_3$) 40 on the tungsten gate 32a to a desired thickness of, for example, 100 to 300 Å. The tungsten oxide film 40 serves as a SAC barrier film. Since the tungsten oxide film 40 is an electrical insulator, it prevents an electric short circuit from occurring between the tungsten gate 32a and a contact plug (not shown) during the subsequent SAC process even if a mask misalignment occurs.

The tungsten oxide film 40 also exhibits a polishing selectivity different from a later-formed interlayer insulating film, for example, a TEOS film. Thus, the tungsten oxide film 40 can be used as a polishing stop layer.

The oxidation process is achieved by conducting an $N_2O$ plasma treatment. It is preferred that a rapid thermal oxidation (RTO) pre-treatment be conducted prior to the $N_2O$ plasma treatment. This is because the thickness of the tungsten oxide film 40 can be more precisely controlled.

The RTO pre-treatment is carried out by ramping up to a temperature of 500 to 700° C. in an atmosphere containing a gas mixture of $N_2$ and $O_2$. The $N_2O$ plasma treatment itself is carried out at a temperature of 400 to 600° C., a pressure between 2 to 5 torr (between 2.4 to 2.6 torr preferred), and a plasma power of 100 to 200 W. The $N_2O$ plasma treatment is conducted for the duration, for example 100 to 200 seconds, needed to form a tungsten oxide of desired thickness.

Although not preferred, the oxidation process for tungsten can be performed using only a furnace annealing. Again while not preferred, the oxidation process can also be performed by using only the RTO treatment without using the $N_2O$ plasma treatment. If only the furnace annealing is used, the tungsten oxidation is more difficult to control because the oxidation rate is more rapid than the combination of RTO pre-treatment and $N_2O$ plasma treatments. Further, a lifting may occur.

On the other hand, if only the RTO treatment is used, the process requires a significant amount of time because the tungsten oxidation rate is slow. For this reason, it is less practical to use the oxidation process only based on the RTO treatment.

Also, the oxidation process for tungsten may be achieved using an $UV-O_3$ annealing. However, like the furnace annealing, the oxidation process based on the $UV-O_3$ annealing involves a rapid tungsten oxidation rate. Further, the resulting tungsten oxide film may not be uniform. For these reasons, it is also less practical to use the oxidation process based on the $UV-O_3$ annealing.

Figure 5A:
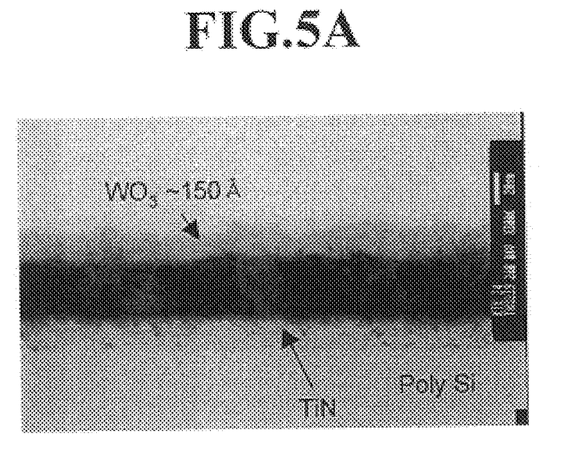
FIG. 5A is a TEM photograph showing a result obtained after an $N_2O$ plasma treatment has been conducted for a sample having a laminated structure consisting of polysilicon (Poly-Si), titanium nitride (TiN), and tungsten
Figure 5B:
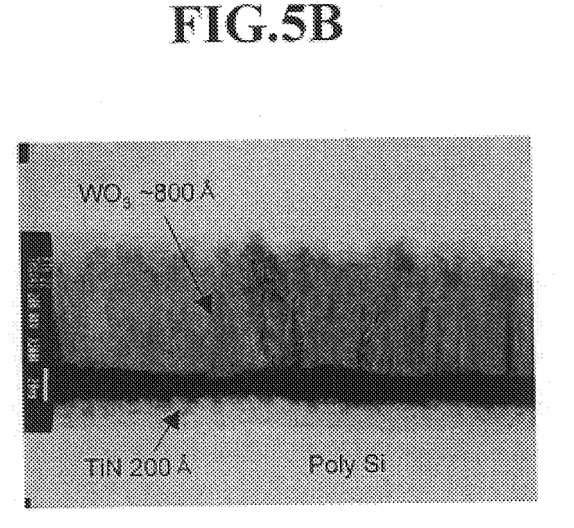
FIG. 5B is a TEM photograph showing a result obtained after a $UV-O_3$ annealing treatment has been conducted for a sample having a laminated structure consisting of polysilicon (Poly-Si), titanium nitride (TiN), and tungsten (W)

FIGS. 5A and 5B are transmission electron microscopic (TEM) photographs respectively showing results of an oxidation process conducted for a sample having a laminated structure consisting of polysilicon (Poly-Si), titanium nitride (TiN), and tungsten (W) under different conditions.

FIG. 5A is a TEM photograph showing a result obtained after an $N_2O$ plasma treatment conducted at a temperature of 400° C., a pressure of 2.5 torr, and a plasma power of 100 W for 120 seconds, wherein the flow rate of $N_2O$ is 2,000 sccm. FIG. 5B is a TEM photograph showing a result obtained after a $UV-O_3$ annealing treatment conducted at a temperature of 400° C.

Referring to FIG. 5A, it can be seen that where the oxidation process is achieved using the $N_2O$ plasma treatment, the tungsten oxide ($WO_3$) film having a uniform thickness of about 150 Å is formed, which is desirable.

On the other hand, referring to FIG. 5B, it can be seen that where the oxidation process is achieved using the $UV-O_3$ annealing treatment, a tungsten oxide ($WO_3$) film having a thickness of about 800 Å, which is excessive, is formed on the tungsten film. This is due to the high tungsten oxidation rate when using the $UV-O_3$ annealing treatment.

Figure 6:
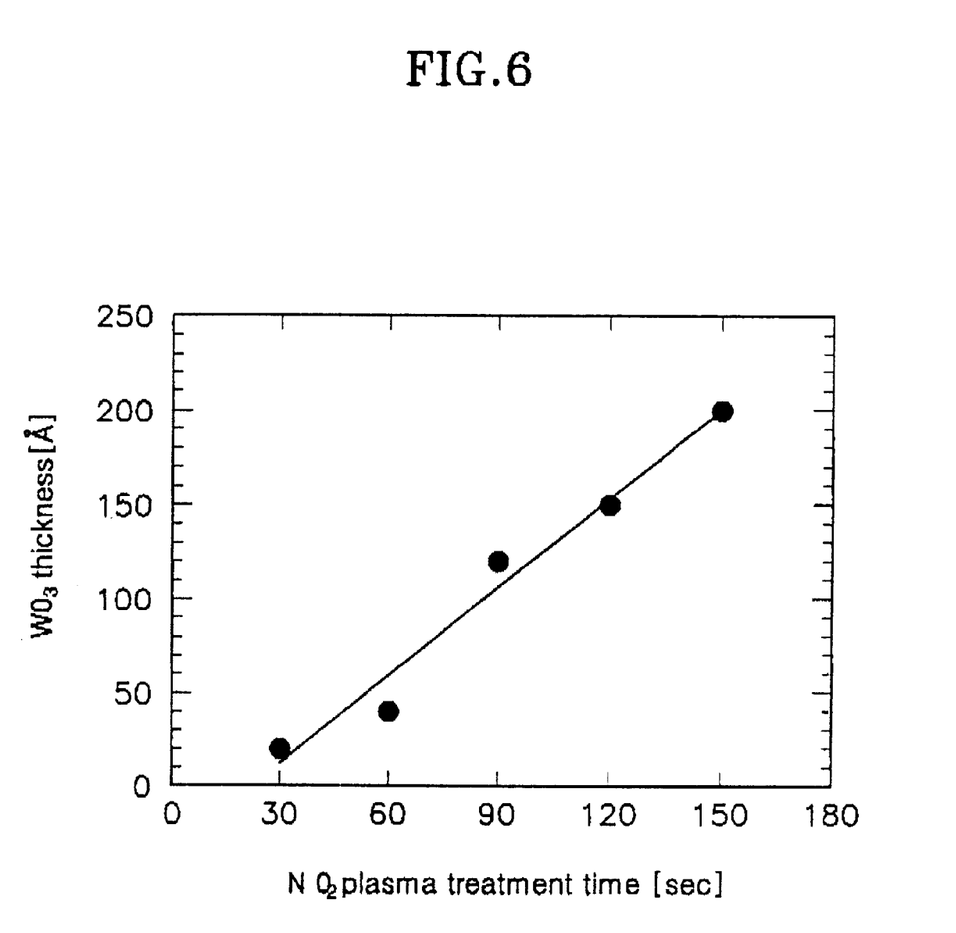
FIG. 6 is a graph depicting a variation in the thickness of the tungsten oxide ($WO_3$) film depending on the processing time of the $N_2O$ plasma treatment.

FIG. 6 is a graph depicting a variation in the thickness of the tungsten oxide ($WO_3$) film depending on the length of the $N_2O$ plasma treatment processing time. In this case, the $N_2O$ plasma treatment was conducted at a temperature of 400° C., a pressure of 2.5 torr, and a plasma power of 100 W.

As shown in FIG. 6, the thickness of the tungsten oxide ($WO_3$) film increases linearly with respect to the processing time of the $N_2O$ plasma treatment. Because of this linearity, the thickness of the tungsten oxide film can be easily controlled. For example, where it is desired to obtain a tungsten oxide ($WO_3$) film having a desired thickness of, such as between 100 to 300 Å, the $N_2O$ plasma treatment can be conducted for about 120 to 150 seconds.

Figure 7A:
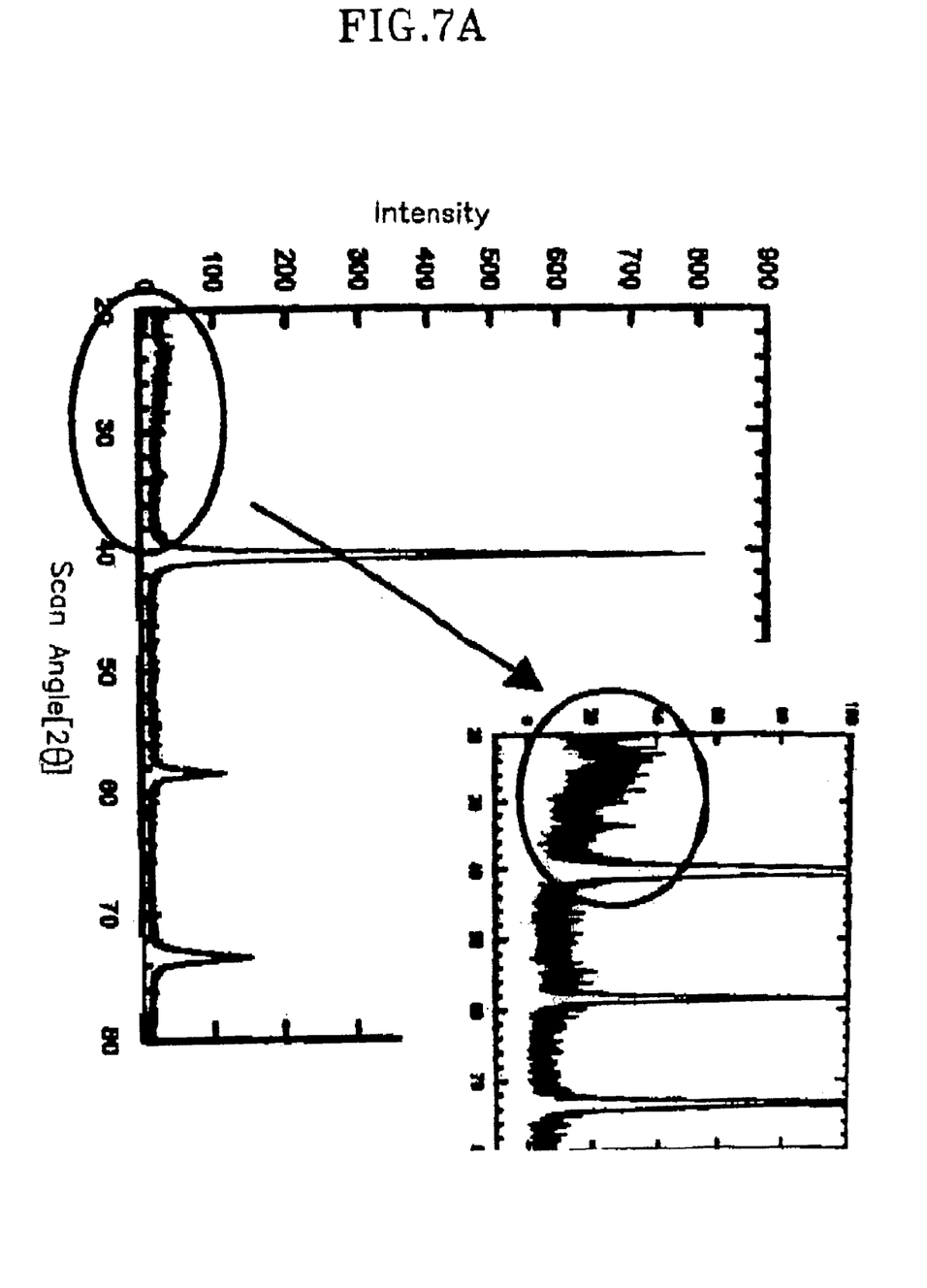
FIG. 7A is an XRD graph for a sample subjected only to an $N_2O$ plasma treatment without being subjected to a rapid thermal oxidation (RTO) pre-treatment.
Figure 7B:
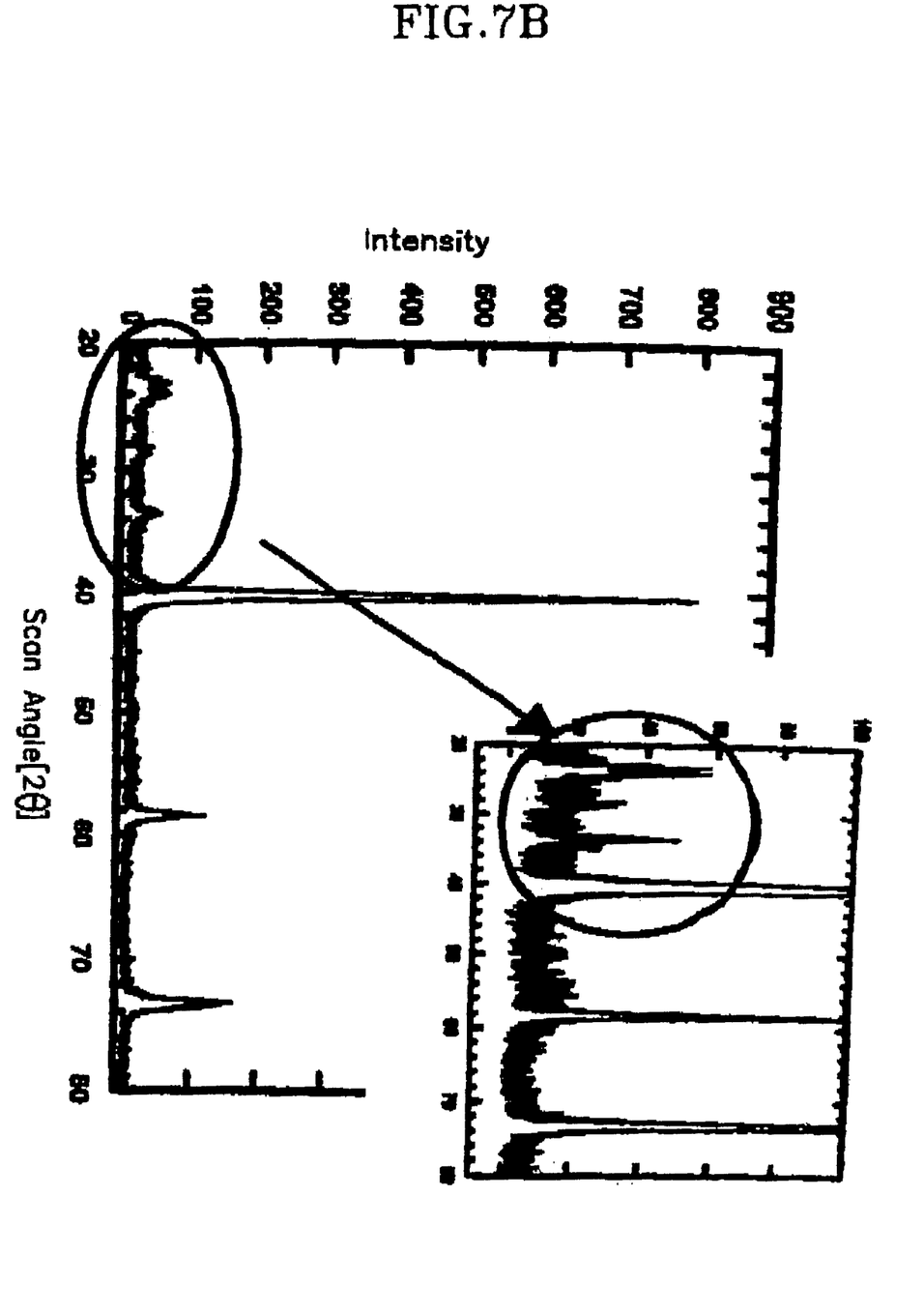
FIG. 7B is an XRD graph for a sample formed with a thin tungsten oxide film subjected to both an RTO pre-treatment and an $N_2O$ plasma treatment.
Figure 7C:
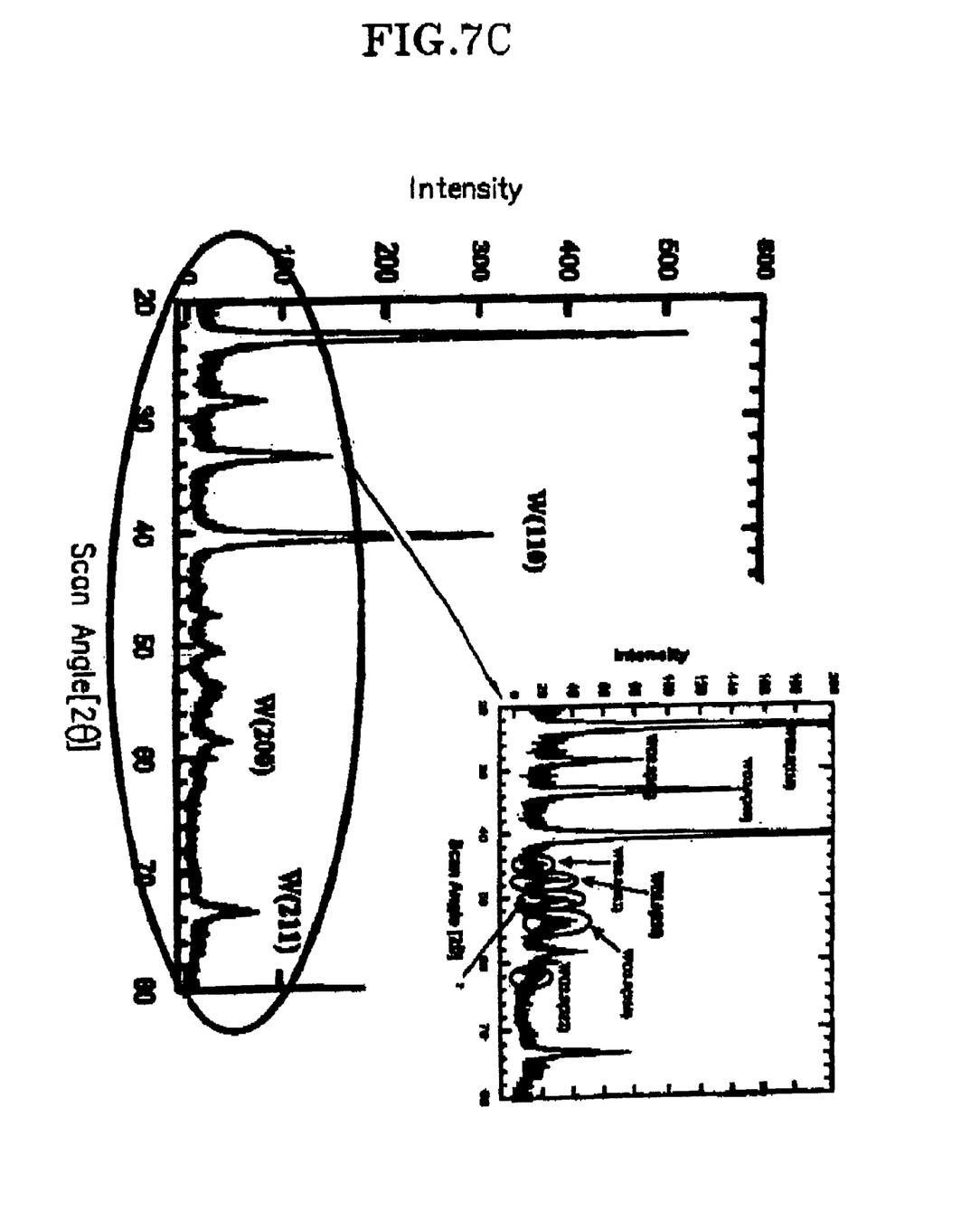
FIG. 7C is an XRD graph for a sample formed with a thick tungsten oxide film also subjected to both an RTO pre-treatment and an $N_2O$ plasma treatment, but where the RTO pre-treatment was conducted in a temperature of 500° C. and in a $N_2/O_2$ atmosphere.

FIGS. 7A to 7C are XRD graphs illustrating effects of the RTO pretreatment. FIG. 7A is an XRD graph for a sample subjected only to an $N_2O$ plasma treatment without being subjected to an RTO pre-treatment. FIG. 7B is an XRD graph for a sample subjected to the RTO pre-treatment and an $N_2O$ plasma treatment, where a thin tungsten oxide film is formed. FIG. 7C is an XRD graph for a sample also subjected to the RTO pre-treatment and an $N_2O$ plasma treatment. However, in this case, a thick tungsten oxide film is formed. Here, the RTO pre-treatment was conducted where the temperature was ramped up to 500° C. in an atmosphere containing a gas mixture of $N_2/O_2$ (1.0/0.15). The $N_2O$ plasma treatment was conducted for 120 seconds.

Where only the $N_2O$ plasma treatment is conducted, relatively few sharp peaks are exhibited in the resultant tungsten oxide film. As shown in FIG. 7A, only three peaks are observable—around scan angles of 40, 58, and 74. Even when the vertical intensity scale is magnified (upper right section of FIG. 7A) for scan angle region between 0 and 40 (oval of the main graph), no distinct sharp peaks are exhibited. That is, the tungsten oxide film has a degraded crystallinity.

On the other hand, where both the RTO pre-treatment and the $N_2O$ plasma treatment are conducted, the resultant tungsten oxide film exhibits relatively sharp peaks, as shown in FIGS. 7B and 7C. In FIG. 7B for example, distinct sharp peaks are exhibited for the scan angle region of 0 to 40 in the magnified graph. That is, the crystallinity is improved over the tungsten oxide film of FIG. 7A. Where the tungsten oxide film is thick, the peaks are more clearly exhibited, as shown in FIG. 7C.

Thus, it can be deduced that the tungsten oxide film has a relatively superior crystallinity when subjected RTO pretreatment prior to $N_2O$ plasma treatment than the tungsten oxide film resulting from the $N_2O$ plasma treatment alone.

The reason why the tungsten oxide film formed on the sample subjected to both the RTO pre-treatment and the $N_2O$ plasma treatment exhibits sharp peaks may be that the fine oxide film formed during the the RTO pre-treatment serves as a seed in the $N_2O$ plasma treatment, thereby enhancing an oxidation of tungsten.

Based on the above mentioned facts, the tungsten oxidation process is carried out using an $N_2O$ plasma treatment. To achieve an enhanced oxidation of tungsten, it is preferred that an RTO pre-treatment is conducted prior to the $N_2O$ plasma treatment.

As apparent from the above description, the present invention makes it possible to easily form a SAC barrier film following the formation of a tungsten gate by using the $N_2O$ plasma treatment, preferably in combination with the RTO pre-treatment. Accordingly, even if a mask misalignment occurs during a subsequent SAC process, electrical short circuit between the tungsten gate and the contact plug is avoided. Also, because the thickness of the tungsten oxide can be easily controlled, increase in the surface resistance of the gate can be avoided.

Consequently, the method for fabricating a MOSFET device having a tungsten gate in accordance with the present invention provides an improvement in the characteristics and reliability of the device in that it allows the application of a SAC process while maintaining the tungsten gate to have a uniform thickness. Furthermore, the method of the present invention can be applied to the manufacture of highly integrated devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a MOSFET device, the method comprising:

forming a sacrificial gate on an active region of a substrate;

forming source and drain regions in the substrate on both sides of the sacrificial gate;

forming an interlayer insulating film above the substrate including above the sacrificial gate;

removing the interlayer insulating film above the sacrificial gate and removing the sacrificial gate to define a groove region;

forming a gate insulating film over the substrate on the interlayer insulating film and in the groove region;

depositing a metal film on the gate insulating film and filling the groove region;

polishing the metal film and the gate insulating film to leave the metal film in the groove region and form a metal gate;

oxidizing the metal gate to form a metal oxide film having a desired thickness on the surface of the metal gate, wherein in the step of oxidizing, the metal gate is subjected to an $N_2O$ plasma treatment;

and conducting a rapid thermal oxidation (RTO) process prior to the $N_2O$ plasma treatment.

2. The method according to claim 1, wherein the $N_2O$ plasma treatment is carried out at a temperature of about 400 to 600° C., a pressure of about 2.4 to 2.6 torr, and a plasma power of about 100 to 200 W.

3. The method according to claim 2, wherein the $N_2O$ plasma treatment is carried out for a period of time capable of forming a tungsten oxide film having a thickness of about 100 to 300 Å.

4. The method according to claim 3, wherein the $N_2O$ plasma treatment is carried out for about 100 to 200 seconds.

5. The method according to claim 1, wherein the RTO treatment is carried out by ramping up to a temperature of about 500 to 700° C.

6. The method according to claim 1, wherein the RTO treatment is carried out in an atmosphere containing a gas mixture of $N_2$ and $O_2$.

7. The method according to claim 6, wherein the ratio of $N_2$ and $O_2$ gas mixture is 1.0/0.15.

8. The method according to claim 1, wherein the metal film is at least one of a tungsten (W), tungsten nitride (WN), titanium (Ti), titanium nitride (TiN), molybdenum (Mo), tantalum (Ta), and tantalum nitride (TaN).

9. The method according to claim 8, wherein the metal film is made of tungsten (W) only.

10. A method for fabricating a MOSFET device, the method comprising:
    forming a sacrificial gate structure on an active region of a substrate;
    forming source and regions in the substrate on both sides of the sacrificial gate in the active region;
    depositing an interlayer insulating film on the active region of the substrate and on the sacrificial gate structure;
    polishing the interlayer insulating film exposing the sacrificial gate structure;
    removing the sacrificial gate structure forming a groove such that spacers define sides of the groove and the substrate is exposed within the groove;
    depositing a gate insulating film in the groove such that the groove is not completely filled;
    forming a metal gate by depositing a metal film in a remainder of the groove; and
    forming a metal oxide on the metal gate, wherein the metal oxide is formed by subjecting the metal gate through a $N_2O$ plasma treatment, and wherein prior to subjecting the metal gate to the $N_2O$ plasma treatment, the metal gate is also subjected to a rapid thermal oxidation (RTO) process.

11. The method according to claim 10, wherein a thickness of the metal oxide ranges from about 100 to about 300 Å.

12. The method according to claim 10, wherein the RTO treatment is carried out by ramping up to a temperature of about 500 to 700° C.

13. The method according to claim 10, wherein the RTO treatment is carried out in an atmosphere containing a gas mixture of $N_2$ and $O_2$.

14. The method according to claim 13, wherein the ratio of $N_2$ and $O_2$ gas mixture is 1.0/0.15.

15. The method according to claim 10, wherein the metal film is at least one of a tungsten (W), tungsten nitride (WN), titanium (Ti), titanium nitride (TiN), molybdenum (Mo), tantalum (Ta), and tantalum nitride (TaN).

16. The method according to claim 10, wherein the metal film is made of tungsten (W) only.

* * * * *